(12) United States Patent
Croix et al.

(10) Patent No.: US 8,161,448 B1
(45) Date of Patent: Apr. 17, 2012

(54) REPLICANT SIMULATION

(75) Inventors: John F. Croix, Austin, TX (US); Aaron T. Patzer, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 1507 days.

(21) Appl. No.: 11/257,272

(22) Filed: Oct. 24, 2005

(51) Int. Cl.
*G06F 11/22* (2006.01)
*G06F 17/50* (2006.01)
(52) U.S. Cl. ...................................................... 716/136
(58) Field of Classification Search ................... 716/4, 5, 716/7, 136
See application file for complete search history.

(56) References Cited

U.S. PATENT DOCUMENTS

| | | | |
|---|---|---|---|
| 6,577,992 B1 | 6/2003 | Tcherniaev et al. | |
| 7,181,383 B1* | 2/2007 | McGaughy et al. | 703/14 |
| 2005/0149312 A1 | 7/2005 | McGaughy | |
| 2005/0273298 A1* | 12/2005 | Shah | 703/2 |

OTHER PUBLICATIONS

"Using Hierarchy and Isomorphism to Accelerate Circuit Simulation," White Paper, Cadence Design Systems, Inc., 2004, 14 pages.
U.S. Appl. No. 11/257,318, filed Oct. 24, 2005, 51 pages.
Office Action from U.S. Appl. No. 11/257,318 mailed Mar. 18, 2008.
Office Action from U.S. Appl. No. 11/257,318 mailed Sep. 26, 2007.

* cited by examiner

*Primary Examiner* — Suresh Memula
(74) *Attorney, Agent, or Firm* — Holland & Knight LLP; Brian J. Colandreo, Esq.; Mark H. Whittenberger, Esq.

(57) ABSTRACT

In one embodiment, a method comprises partitioning a circuit description into a plurality of simulateable partitions. The partitioning is independent of a hierarchy specified in the circuit definition. The method also comprises sorting the plurality of simulateable partitions into one or more groups, wherein each simulateable partition included in a given group is equivalent to each other partition in the given group. Further, the method comprises simulating a first simulateable partition in the given group responsive to one or more input stimuli to the first simulateable partition. For each other simulateable partition in the given group that has approximately the same input stimuli as the first simulateable partition, the method still further comprises using a result of simulating the first simulateable partition as a result of the other simulateable partition.

28 Claims, 12 Drawing Sheets

REPLICANT SIMULATION

BACKGROUND

1. Field of the Invention

This invention is related to the field of electronic circuit simulation.

2. Description of the Related Art

Circuit simulation tools provide a way for the circuit designer to simulate the behavior of a complex design, identify any problems, and make alterations and enhancements to the circuit before arriving at a final design. That iterative design process has in turn improved the reliability of the end products that incorporate a given circuit design. One of the most popular circuit simulation tools is the Simulation Program with Integrated Circuit Emphasis (or SPICE). Many commercial versions of SPICE are available. In addition to SPICE-like simulators, functional simulators (which primarily are used to verify logical function of circuits) are often used, such as high level description language (HDL) simulators. HDL simulators include both event-driven simulators and cycle-based simulators.

While considered highly accurate, traditional SPICE is typically too slow for the analysis of large circuits, as the single design matrix that SPICE uses to solve the system of equations describing the circuit can grow quadratically with the number of circuit elements. To work around this limitation, so called "Fast-Spice" simulators in part achieve greater speed by intelligently partitioning a single design matrix into many smaller matrices. These small partition matrices are solved independently, and their solutions combined to form an overall solution. Design partitioning is often based on either channel-connected components or user-defined design hierarchy. A channel-connected component consists of nonlinear elements which are graph-connected through their channel terminals, along with graph-connected linear elements.

A modern silicon chip may contain millions of gates, flip-flops, registers, and cells. Many of these design primitives are electrically identical or nearly so—that is, they have the same transistor configurations and sizing and are driving an equivalent (or nearly equivalent) load. For example, a design may contain thousands of identical NAND gates all driving a capacitive load of between 1.2 and 1.4 femto-Farads (fF).

Often, these electrically equivalent entities see the same input transitions—a rising or falling edge of the same shape, direction, and duration—at the same time. This is referred to as "spatial repetition," as two different instances of an electrically equivalent entity that are separated by space undergo identical state transitions. The phenomenon of spatial repetition is particularly common in N-bit wide logic, where adjacent electrical partitions see identical transitions from the prior stage data-path logic. Further, over the course of a long transient simulation, partitions will often see the same input stimulus transitions many times. This is referred to as "temporal repetition" or repetition across time. A partition may generally refer to any portion of an overall circuit design.

In the prior art, it has been impossible (or at least impractical) to fully exploit spatial and temporal repetition in a simulation. By attempting to match only against states derived from the same hierarchical definition (e.g. the Tcherniaev method described below), the opportunity to match partitions from different definitions which are exactly or nearly equivalent is lost. Further, attempting to match a transient partition state against all other partition states in the design is too time-consuming. The probability that all internal state variables (node voltages, capacitor charges, inductor currents, etc.) will match between two arbitrary partitions at an arbitrary point in time is typically too low to make that search worthwhile.

Traditional SPICE takes no advantage of either spatial or temporal repetition in simulation. Instead, the entire design is simulated simultaneously in a single monolithic matrix. U.S. Pat. No. 6,577,992 by A. Tcherniaev, et. al. takes advantage of the spatial repetition inherent in hierarchical microelectronic circuit design. In the Tcherniaev mechanism, the user-defined hierarchical structure limits the matching to only those circuits having identical hierarchy. This precludes matching, for example, two NAND gates which are in entirely different subcircuits, but are loaded similarly (or are structurally different, but behave similarly from a functional standpoint). Furthermore, the Tcherniaev method compares the dynamic voltage state of a particular instance to all other dynamic voltage states associated with the corresponding subcircuit definition for isomorphism. Since the number of potential dynamic voltage states is essentially infinite, the probability that two states match at an arbitrary point during transient simulation is low. U.S. Patent Application Publication 2005/0149312 describes another mechanism that relies on hierarchy.

SUMMARY

In one embodiment, a method comprises partitioning a circuit description into one or more simulateable partitions. The partitioning is independent of a hierarchy specified in the circuit description. The method also comprises sorting the simulateable partitions into one or more groups, wherein each simulateable partition included in a given group is equivalent (or nearly equivalent) to each other partition in the given group. Further, the method comprises simulating a first simulateable partition in the given group responsive to one or more input stimuli to the first simulateable partition. For each other simulateable partition in the given group that has approximately the same input stimuli as the first simulateable partition, the method further comprises using a result of simulating the first simulateable partition as a result of the other simulateable partition.

In another embodiment, a method comprises partitioning a circuit description into one or more simulateable partitions, wherein the partitioning is independent of a hierarchy specified in the circuit description; and simulating the one or more simulateable partitions. The simulating comprises sorting the simulateable partitions into one or more groups, wherein each simulateable partition included in a given group is equivalent within a specified tolerance. Each group comprises an internal state that is reached at a point during the simulation for at least one simulateable partition. The simulating further comprises moving a first simulateable partition from a first group to a second group responsive to the input stimuli to the first simulateable partition being approximately the same as the input stimuli to a previously simulated simulateable partition that was included in the first group and the second group was created in response to simulating the previously simulated simulateable partition. Computer readable media storing instructions that implement the methods are also contemplated.

BRIEF DESCRIPTION OF THE DRAWINGS

The following detailed description makes reference to the accompanying drawings, which are now briefly described.

Figure 1:
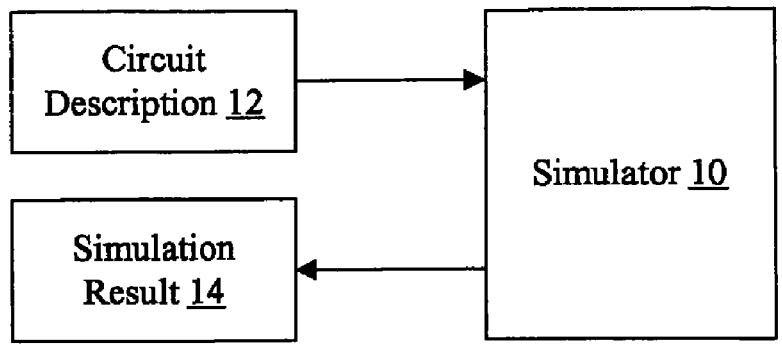
FIG. 1 is a block diagram of one embodiment of a simulator, a circuit description, and a simulation result.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Simulation Overview

Turning now to FIG. 1, a block diagram of one embodiment of a simulator 10 is shown. The simulator 10 is coupled to receive a circuit description 12 corresponding to a circuit, and is configured to simulate the circuit and generate a simulation result 14. The simulation result 14 represents operation of the circuit under the stimulus applied during the simulation.

Generally, the simulator 10 may comprise software (e.g. sequences of instructions) which, when executed on a computer, simulate a circuit described in the circuit description 12. Any type of simulation may be performed. For example, in one embodiment, the simulator 10 may be a SPICE-like simulator that performs various electrical/timing simulations for the circuit. In other embodiments, the simulator 10 may be a functional simulator such as an HDL simulator.

In one embodiment, the simulator 10 may implement spatial replicant simulation, as described in more detail below. In another embodiment, the simulator 10 may implement temporal replicant simulation, as described in more detail below. In still another embodiment, the simulator 10 may implement both spatial and temporal replicant simulation.

The circuit description 12 may comprise one or more files that contain the description of the circuit for simulation. For example, in SPICE-like embodiments, the circuit description may describe the elements of a network and their connections to nodes in the network. The circuit description in some such embodiments may also describe the simulation to be performed (e.g. type, length, outputs to record in the simulation result 14, etc.), the input stimuli, etc. In other embodiments, the description may be an HDL description (e.g. Verilog, VHDL, etc.). Other circuit descriptions may include detailed standard parasitic format (DSPF) or standard parasitic exchange format (SPEF). Generally, any circuit description in any language/format may be used.

The simulator 10 may read the circuit description 12 and simulate the circuit, producing a simulation result 14 that represents the operation of the circuit according to various applied input stimuli (e.g. voltages, currents, etc.). In one embodiment, the simulation result 14 may comprise one or more files that may be stored (e.g. on a computer accessible medium 200, shown in FIG. 13). The user may use the simulation output to enhance the circuit design, validate that the design operates as intended, etc.

In one embodiment, the simulation may be performed as a series of timesteps. The increment of time between timesteps may be fixed, or may vary from timestep to timestep. Generally, the timestep is the granule of time by which the simulation progresses, and a state of the circuit, input stimulus, and/or output at each timestep is recorded as part of the simulation result 14. The input stimulus may comprise a voltage and/or current wave form (e.g. a piecewise linear (PWL) wave form other wave form). The output may comprise one or more signals, each of which may comprise a voltage or current wave form. In other embodiments, simulation may progress in other fashions (e.g. cycle-based, dependent on a clock cycle defined for the circuit, etc.).

Spatial Replicant Simulation

In one embodiment, the simulator 10 may detect spatial replication of simulateable partitions and their input stimulus, and may take advantage of the replication to speed the simulation. A representative partition of the spatially replicated partitions may be simulated, and the result may be used as the result for the other replicant partitions. Particularly, the simulator 10 may be configured to partition the circuit described in the circuit description 12 into simulateable partitions independent of any hierarchy that may be specified in the circuit description 12. That is, the partitions may be defined without regard to the user-specified hierarchy in the circuit description 12. For example, partitions may be defined that cross user-defined hierarchical boundaries. A typical user-defined hierarchy includes multiple blocks, each of which may themselves include hierarchy, that define various functions implemented in the circuit. In such cases, the simulateable partitions may be defined to cross block boundaries. Simulateable partitions may include other non-linear elements (like pass gates). Generally, a simulateable partition may be any portion of a circuit description that can be divided from the description and which may be simulated, by applying input stimuli to one or more inputs of the simulateable partition and determine the resulting output of the simulateable partition and internal state of the simulateable partition. The term partition may be used to more succinctly refer to a simulateable partition.

The simulator 10 may initially sort the simulateable partitions into replicant groups. Each simulateable partition within a given group is equivalent to other simulateable partitions in the group. A group may include only one partition, in some cases, if no other partition is equivalent to that partition within the specified tolerance. The partitions need not be identical, but may be equivalent if their operation in the simulation in response to input stimuli is within a specified tolerance, so that the error introduced in the simulation by equating the results is minimal. Furthermore, simulateable partitions may be equivalent even if not included in the same level of the user-defined hierarchy. For example, partitions from a multiplier may be equivalent to partitions from an adder or other circuitry. The tolerance may be specified in any desired fashion (e.g. percentage difference, standard deviation, etc.). The tolerance may be programmable or fixed, in various embodiments. Other tolerances described herein may similarly be specified in any fashion and may be fixed or programmable.

The simulator 10 may simulate a first partition from the replicant group in response to input stimuli, producing a new replicant group updated to a state determined from simulating the first partition. The new replicant group may be linked to the previous replicant group the included the first partition, and the input stimuli used to simulate the first partition is also recorded with respect to the link. When other partitions in the previous replicant group are ready to be simulated, the input stimuli to such partition is compared to the links. If the input stimuli is the same (or approximately the same, e.g., within a specified tolerance) as the input stimuli associated with one of the links, the partition may not be simulated and may instead by moved to the replicant group indicated by the link.

In one embodiment, no comparison of internal state in a group may be needed to determine if a given partition's simulation can be avoided. The determination may be based on comparing only inputs of the given partition to inputs previously simulated for another member of the replicant group. Since the given partition and the previously simulated partition were in the same replicant group, the internal state is known to match. Furthermore, comparison to other partitions that are similar but are known not to have the same state (since they are in different replicant groups) may be avoided. In this manner, the "cost" (e.g. measured in execution time) of implementing replicant simulation may be relatively low. Viewed in another way, replicant simulation may be efficient in these embodiments.

Spatial replicants may occur in many circuit designs. For example, many designs include N-bit wide data-path logic. N-bit wide data path logic performs the same function on each of N-bits (usually comprising an N-bit value that has some assigned meaning as a whole). For example, shifting, masking, or other arithmetic/logic operations may be performed on N-bit data. Partitions in the N-bit data path often have the same circuitry and the same load. A subset of the N-bits may transition from zero to one (or vice versa) approximately simultaneously, with approximately the same waveform, and may be identified as spatial replicants. As another example, in synchronous designs, the clock pulse is often seen by many flip-flops, registers, and clock-buffers at the same time. Thus, many of the partitions containing these primitives will also see the same input transitions at the same time.

Figure 2:
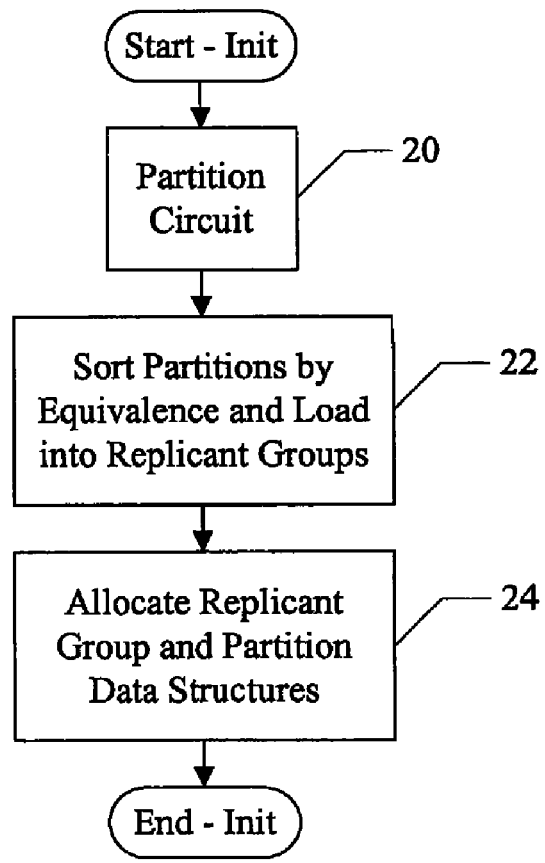
FIG. 2 is a flowchart illustrating operation of one embodiment of the simulator during initialization.

Turning now to FIG. 2, a flowchart illustrating operation of one embodiment of the simulator 10 to initialize a simulation is shown. The simulator 10 includes instructions which, when executed, implement the operation shown in FIG. 2. While the blocks are shown in a particular order, other orders may be used. Other initialization operations may be supported as well, in various embodiments.

The simulator 10 may read the circuit description 12 and may partition the circuit into simulateable partitions (block 20). As mentioned previously, the partitioning may be performed without regard to any user-defined hierarchy in the circuit description (or any other hierarchy that may be in the circuit description, for that matter). The partitioning may use any desired partitioning algorithm (e.g. channel-connected components, a min-cut algorithm, user defined subcircuit boundaries, division at standard cell inputs, etc.). By using either pattern recognition of common transistor configurations, or user-defined subcircuits, primitive gates or "cells" such as AND, OR, and INV may be identified. In CMOS embodiments, cell inputs are those ports leading only to transistor gate terminals. Transistor gate terminals are high impedance boundaries, and thus there may be less correlation between the outputs that are connected to such inputs and the operation of the partition that includes those inputs.

The simulator 10 may sort the partitions by equivalence and load into replicant groups (block 22). That is, the partitions included in a given replicant group are equivalent and have equivalent load (or nearly equivalent load). The sort may be a topological sort based on the circuitry and load included in the partitions, for example. The topological sort may be based on cell definition, pattern matching transistors to standard functionality, or matching non-linear elements in the partitions, for example.

The equivalence may be measured in a variety of ways. For example, partitions may be electrically and functionally equivalent, within a defined tolerance. For functional simulation such as cycle simulation, functional equivalence may be sufficient and electrical equivalence may be ignored.

There are numerous other ways in which partitions may be compared for equivalence. In general, the method which matches the most partitions into the fewest replicant groups while minimizing any error introduced through the "fuzzy matching" of equivalence may be preferred. Other ways to measure equivalence may include, for example, one or more of the following:

In the strictest embodiments, partitions are structurally identical with identical element values.

Partitions may be structurally identical with element values equal to within a configurable tolerance.

The linear load portion of the partition may not be strictly identical in either element values or topological arrangement. However, from an electrical perspective, the load presented to the non-linear elements may be "close enough" to allow two instances to be deemed equivalent. For example, the RC equivalent for the loads may be determined, and the RC equivalents may be within a configurable tolerance of each other.

The load may be altered and only the significant portion of the load may be compared. For example, the load may be converted to poles/residues form and a comparison of only the significant poles may be made. Viewed in another way, the topology need not be strictly physical for the purposes of comparison. Other examples of altering the loads may include using a PI model for the load.

The load may be altered in form without significantly changing its electrical behavior. For example, capacitors coupled to another load may be broken from that load and tied to ground.

The load may or may not take into account the cell or block being driven by the partition. In other words, the topological sorting may occur strictly as a function of interconnect.

The interconnect may be ignored and the load used for sorting may strictly be a function of the cell or block being driven by the partition.

Non-linear drivers and linear loads may be separated and matched into non-linear and linear equivalence groups, respectively.

Partitions may be characterized and matched according to their "black-box" functional equivalence.

The sensitivity of the driving circuitry to variations in the load may be used to determine which loads are equivalent. If the operation of the driving circuitry is approximately the same for two loads, the loads may be deemed to be equivalent. Accordingly, the variation in loads that are deemed equivalent may vary from partition to partition.

Partitions may be equivalent even if they are not topologically equivalent, if the have equivalent macro models. For example, a large inverter consisting of two large transistors may be one partition, and another large inverter consisting of several parallel smaller transistors may be another partition. The two may be electrically equivalent in terms of drive strength though topologically different. If the two are replaced by the same macro model, they may be viewed as equivalent and may be sorted into the same replicant group.

Equivalence may be determined by matching the driving or non-linear circuitry of a partition (e.g. ignoring load). Per-instance variations in load may later be used to modify (or scale) the output waveform produced for a replicant group, in some embodiments. For example, if the representative partition that is simulated for a replicant group has a 1.0 fF capacitive load, another partition in the group having a smaller load (e.g. 0.5 fF) may have an output waveform generated by contracting the output waveform from the representative partition to model the smaller load. Similarly, another partition in the group having a larger load (e.g. 2.0 fF) may have an output waveform generated by expanding (or stretching) the output waveform of the representative partition to model the larger load.

If a load on a partition includes an input pin to a cell in another partition (e.g. the load includes one or more gate terminals of transistors in the other partition, for CMOS embodiments), the input pin load may be modeled in a variety of fashions. For example, the input pin load may be represented by an input pin capacitance (Cin), a non-linear capacitance, or by the actual cell load (and potentially, the load on that cell).

In some embodiments, replicant groups may be formed and/or tracked in a somewhat hierarchical fashion. For example, replicant groups may be formed first by logical function or active structure (e.g. transistor structure), then by differing loads underneath that logical function. The differing loads may be deemed equivalent (or grouped) within a configurable tolerance (e.g. any capacitive load between 0.5 fF and 1.0 fF may be deemed equivalent and may be included in the same group). If desired, the result for a given partition may be scaled according to actual load, as mentioned above. If replicant groups are tracked in this fashion, all replicants that have the same logical function and no input transition in a given timestep may be grouped into the same quiescent group at the function level, for example, even though loads may differ significantly.

In some embodiments, an additional factor that may affect the initial sorting is any initial conditions that may be assigned to a partition (or subcomponent of the partition). The initial replicant groups created by the sort may be "quiescent groups", since the simulation may begin with all circuitry in a quiescent state. If an initial condition that is different from the internal state of the quiescent group is assigned to an otherwise equivalent partition, that partition is no longer equivalent and may be assigned to its own replicant group. Other partitions that are equivalent and have the same initial condition may be added to this additional replicant group.

In one embodiment, the partitions in a replicant group share the same internal state data. That is, the internal state may not be copied for each partition. Instead, each partition may be aliased to the same internal state. For example, a data structure associated with each partition may include a pointer to a data structure that includes the internal state. By sharing the internal state, the amount of memory consumed in the simulation may be reduced. Other embodiments may copy the internal state, if desired.

The simulator 10 may allocate data structures for each replicant group and for each partition (block 24). Additionally, a per-equivalent-partition data structure may include a definition of the data structure (e.g. elements, values, and connection of the elements). This data structure is referred to below as the partition definition data structure.

Figure 3:
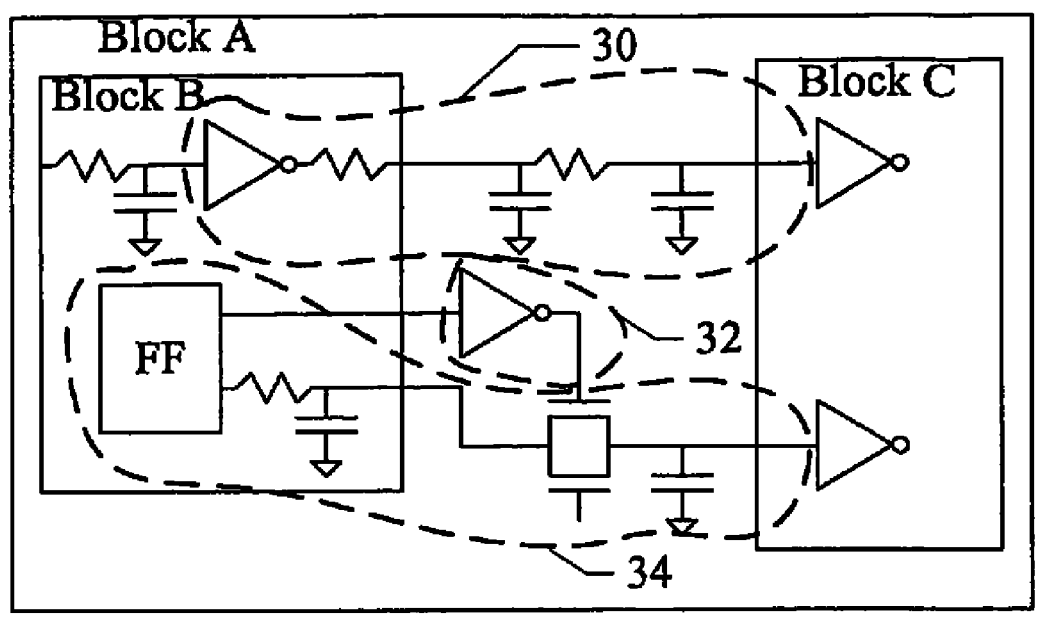
FIG. 3 is a block diagram of an exemplary circuit description illustrating one embodiment of partitioning the circuit for simulation.

FIG. 3 is a block diagram of an example illustrating the partitioning of a circuit independent of hierarchy defined in the circuit definition. The circuit includes a block A that includes a block B and a block C, as well as various elements. Various elements included in the blocks B and C are also illustrated. Partitions are illustrated by dotted circles around elements. Thus, in the example of FIG. 3, a partition 30 is defined that includes elements from block B and block A. A partition 32 is defined in block A, and a partition 34 is defined that includes elements from blocks B and A as well.

Figure 4:
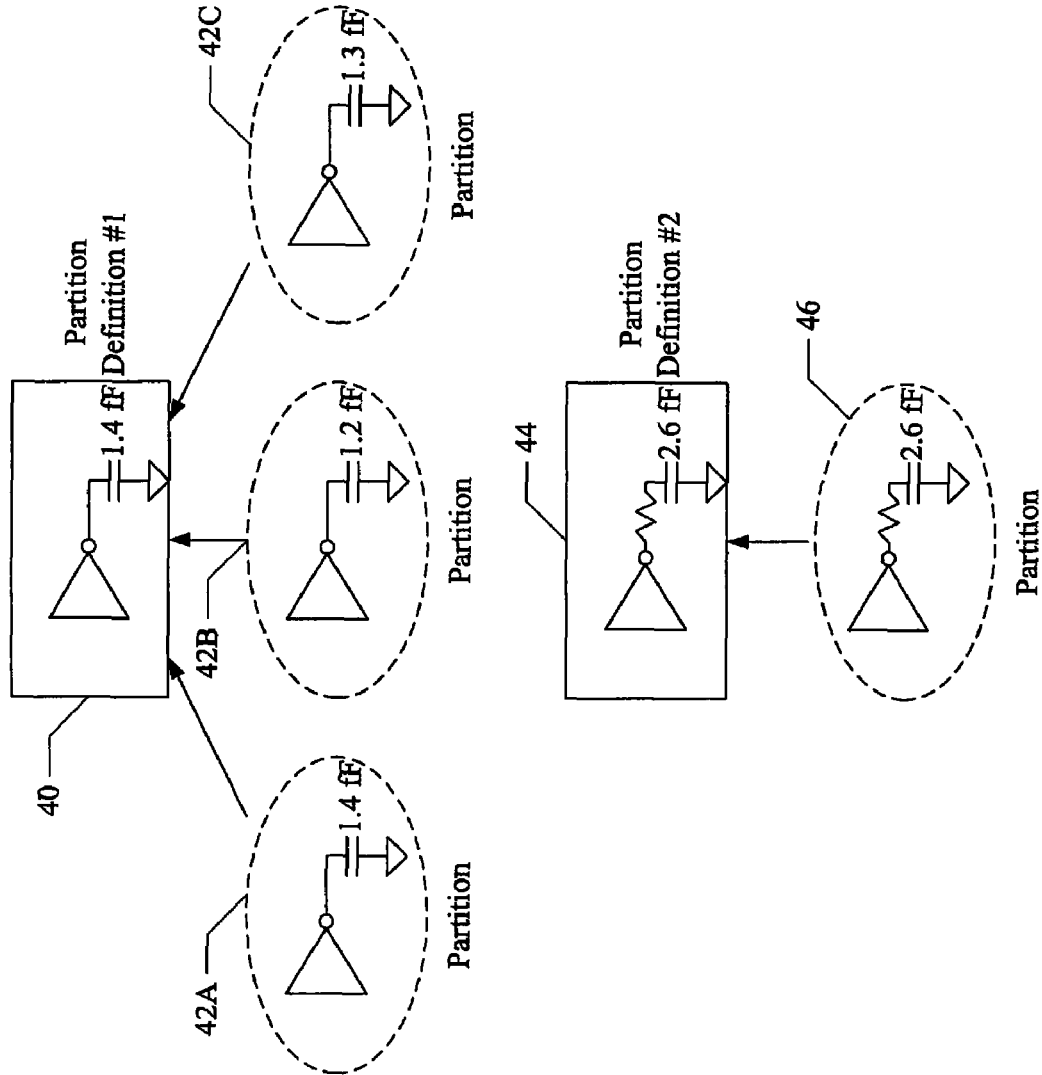
FIG. 4 is a block diagram of exemplary partition definitions and partitions.

Turning now to FIG. 4, a block diagram is shown illustrating exemplary partition definitions and exemplary partitions that are equivalent to the partition definition, for one embodiment. In the illustrated embodiment, for example, a partition definition 40 is generated that includes an inverter driving a 1.4 fF load. Partitions 42A-42C are considered to be equivalents to the partition definition 40 in this example. The structural configuration of each partition 42A-42C is identical to the partition definition 40 (inverters driving capacitors). However, the load element value varies (e.g. 1.4 fF for partition 42A, 1.2 fF for partition 42B, and 1.3 fF for partition 42C). A second partition definition 44 is shown, with one partition 46 equivalent to the definition.

When partitions are included in the same replicant group, the partition defined in the corresponding partition definition may be the partition that is simulated for that equivalence group, in one embodiment. For example, if the partitions 42A-42C are included in a replicant group, the partition in the partition definition 40 may be simulated. Thus, a partition definition data structure may be defined that includes the elements and element values to be simulated, and the partition data structures may include a pointer to the partition definition data structure.

Figure 5:
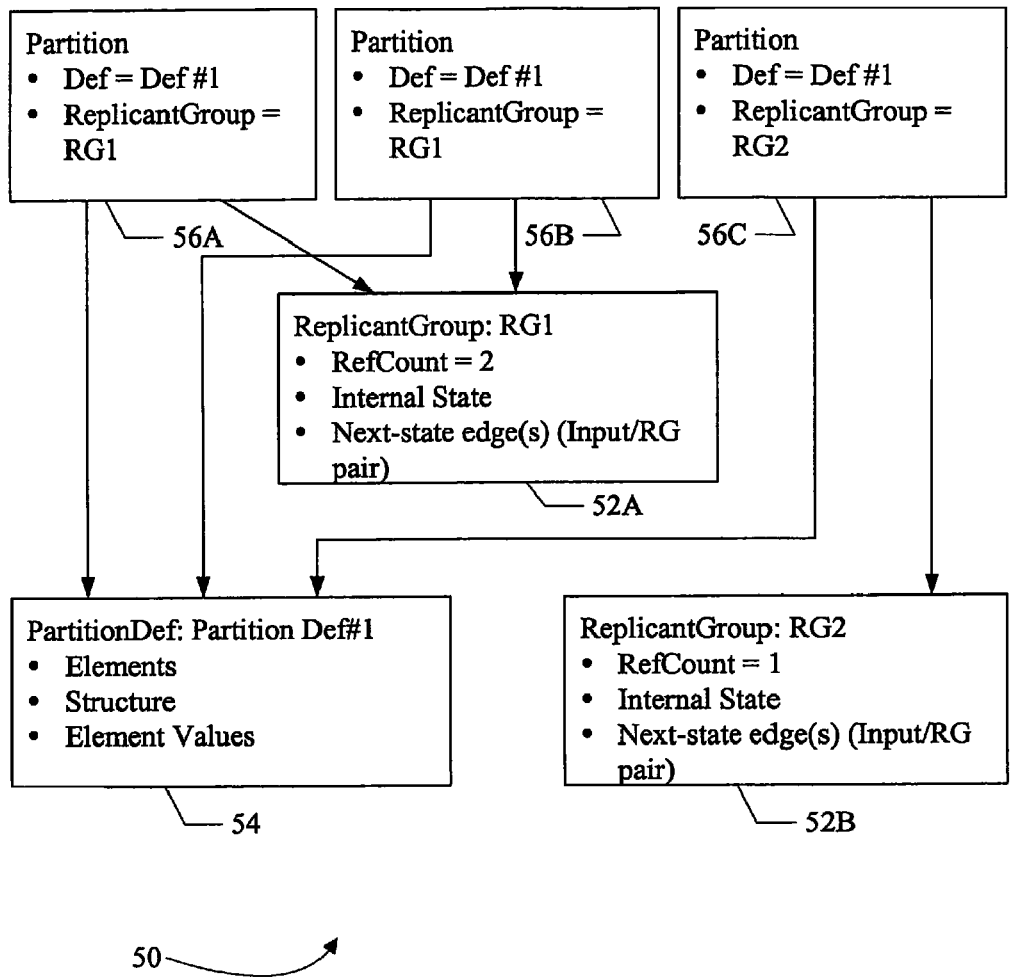
FIG. 5 is a block diagram of one embodiment of data structures that may be implemented by the simulator.

Turning now to FIG. 5, a block diagram is shown illustrating one embodiment of data structures 50 that may be used by one embodiment of the simulator 10 for replicant simulation. The data structures 50 include one or more replicant group data structures 52A-52B, a partition definition data structure 54, and one or more partition data structures 56A-56C.

In the illustrated embodiment, the replicant group data structures 52A-52B each include a reference count (RefCount), the internal state corresponding to the partition for this replicant group, and zero or more next-state edges. The reference count is the number of partitions that are currently referencing the corresponding replicant group (e.g. two for replicant group 52A and one for replicant group 52B in this example). That is, each referencing partition has the internal state maintained by the replicant group data structure 52A-52B as its internal state. In the example of FIG. 5, partitions corresponding to partition data structures 56A-56B are in replicant group RG1, and thus reference replicant group data structure 52A. The partition corresponding to partition data structure 56C is in replicant group RG2, and thus references the replicant group data structure 52B.

The internal state of the replicant group data structures 52A-52B is the internal state of the partitions in that replicant group that resulted from the input stimuli that lead to that replicant group. The internal state may comprise any set of data that represents the state. For example, in one embodiment for SPICE-like simulation, the internal state may include one or more of: node voltages, companion currents, error calculations, prior history, etc. In some embodiments, combinatorial logic partitions may not have an "internal state", since the state is determined by the input stimulus.

The next-state edges identify transitions to other replicant groups that have occurred due to previous simulations of partitions that were in the replicant group. That is, a partition that was previously a member of the replicant group was simulated, and the result of that simulation was created as a new replicant group. In the illustrated embodiment, each next-state edge may each comprise an input stimuli identifier/replicant group pointer pair. The input stimuli identifier may describe the input stimuli that was previously simulated to create the replicant group that is pointed to by the replicant group pointer. For example, an input stimulus may be one section of a piecewise linear waveform. Such a stimulus may be described as a slope and duration. Other input stimuli may be described in any suitable manner, such as one or more values, an equation, etc.

In this embodiment, the equivalent partitions derive from a single representative partition definition, described in the partition definition data structure 54. The equivalent partitions may use the same partition definition data structure 54 even if they are included in different replicant groups because of different input stimuli. The partition definition data structure 54 may describe the elements included in the partition, the structure of those elements, and element values.

Each partition data structure 56A-56C corresponds to a different one of the equivalent partitions that share the partition definition data structure 54. In this embodiment, each partition data structure 56A-56C may include a definition pointer (Def) that points to the partition definition data structure 54 and a replicant group pointer (ReplicantGroup) that points to the replicant group data structure 52A-52B to which the partition currently belongs.

While FIG. 5 illustrates data structures that may be used in one embodiment of the simulator 10, other embodiments may implement any desired set of data structures, including subsets and/or supersets of those shown in FIG. 5. For example, embodiments may implement the partition definition data structure 54 and instead include a description of the partition structure in the partition data structures 56A-56C or the replicant group data structures 52A-52B. Similarly, the internal state may not be stored in the replicant group data structures 52A-52B, and may instead be in the partition data structures 56A-56C. In such an embodiment, if a given partition is determined to be in a new replicant group with a previously simulated partition, the internal state from the previously simulated partition's data structure 56A-56C would be copied to the given partition's data structure 56A-56C. Any desired data structures may be used in various embodiments.

Additionally, in some embodiments, partitions for which there are no equivalents in the circuit may not use the same data structures 50, since there are no replicants. For example, a single data structure with the partition's structure and internal state may be sufficient for such partitions. Other embodiments may use the same data structures 50 in these cases.

In one embodiment, a graph of state (represented by replicant groups) and state transitions (represented by next-state edges between replicant groups) is constructed for each set of equivalent partitions. Generally, simulation of a partition at a particular point in time proceeds as follows: if the input stimuli to the partition matches (or nearly matches) input stimuli described in a next-state edge of the replicant group that includes the partition, alias the partition to the replicant group indicated by that next-state edge; if no matching input stimuli exists, simulate the partition instance, then create a connection from the prior replicant to the new replicant group so that future simulations having the same input stimuli may avoid simulation.

Figure 6:
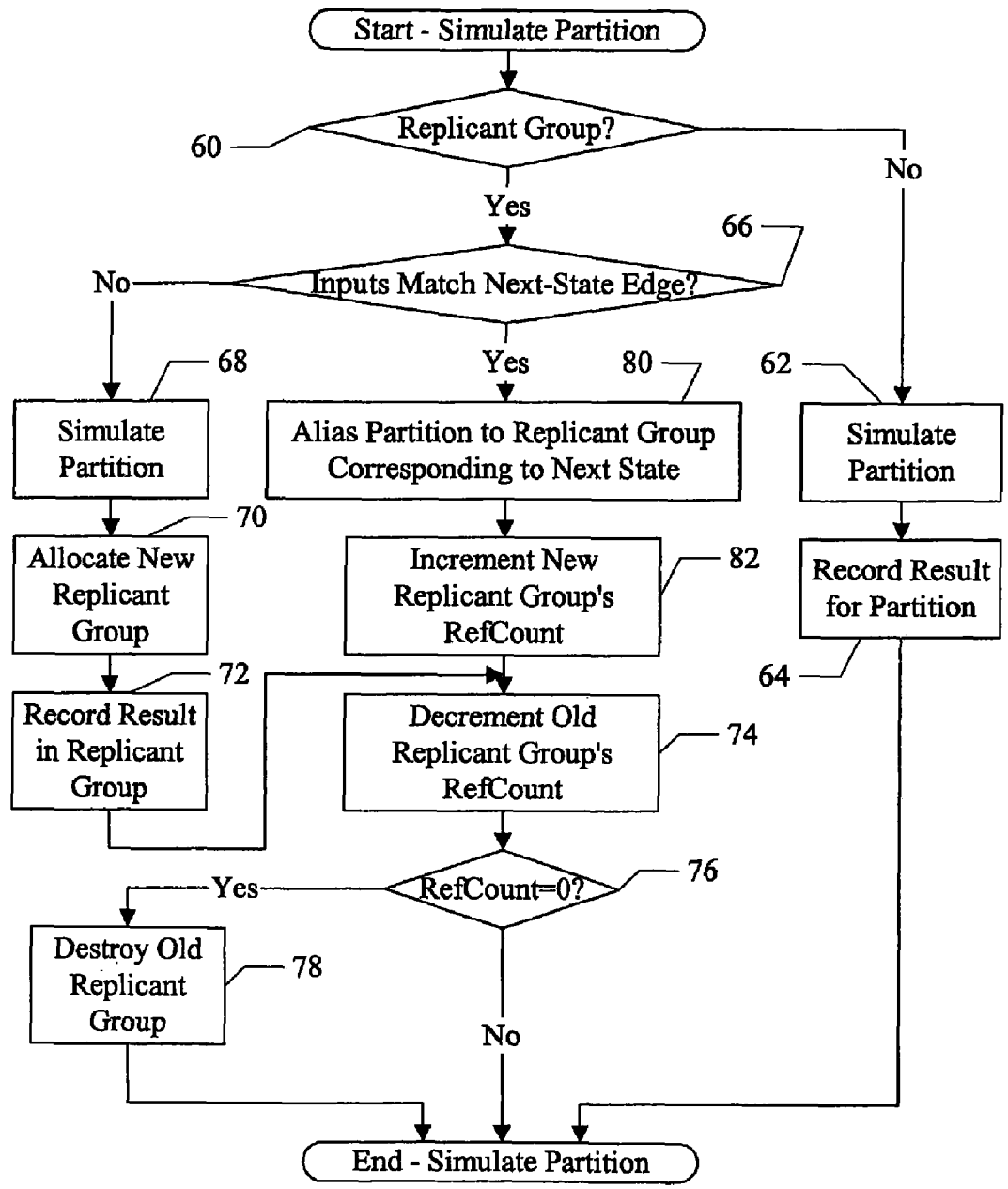
FIG. 6 is a flowchart illustrating operation of one embodiment of the simulator to simulate a partition.

Turning now to FIG. 6, a flowchart is shown illustrating operation of one embodiment of the simulator 10 to simulate a partition. The flowchart of FIG. 6 may be performed, for example, each time that a partition is scheduled to simulate. The simulator 10 may implement any partition scheduling algorithm. In general, any partition whose input stimuli are available and which hasn't yet been simulated may be eligible to be scheduled. The partitions may all be simulated for a given timestep before progressing to the next timestep, in some embodiments. The simulator 10 may comprise instructions which, when executed on a computer system, implement the operation illustrated in FIG. 6. While the blocks are shown in a particular order, other orders may be used.

The simulator 10 may determine if the partition is a member of a replicant group (decision block 60). If the partition is not a member of a replicant group (decision block 60, "no" leg), then the partition is simulated and the result is recorded for the partition (blocks 62 and 64).

If the partition is a member of a replicant group (decision block 60, "yes" leg), the simulator 10 may determine if the input stimulus to the partition matches any of the next-state edges in the replicant group (decision block 66). As mentioned previously, the input stimuli may be matched to within a configurable tolerance to the stimuli described in the next-state edges. For example, a PWL section may be matched if the duration and slope are both within a tolerance (e.g. a few percentage points) of each other. If the input stimuli does not match any of the next-state edges for the replicant group (decision block 66, "no" leg), then the input stimulus of the partition is differing from previously simulated partitions that were members of the replicant group. Accordingly, the partition will be included in a newly-created replicant group. The simulator 10 simulates the partition (block 68), and allocates a new replicant group data structure for the partition (block 70). The simulator 10 may set the reference count in the newly-created data structure to one and update the replicant group pointer in the partition data structure corresponding to the partition to point to the newly-created data structure. The simulator 10 may also update the old replicant group (of which the partition was a member prior to simulating) with a new next-state edge to point to the newly-created replicant group for the input stimuli provided to the partition. Additionally, in some embodiments, the simulator 10 may copy the internal state from the old replicant group to preserve internal state that may not be modified due to the input stimuli. In other embodiments, the simulator 10 may calculate the entire internal state when simulating the partition, and no internal state need be copied. The simulator 10 may record the result of the simulation in the internal state of the newly-created replicant group data structure (block 72) and may decrement the reference count in the old replicant group's data structure (block 74) to reflect removal of the partition from that replicant group. If the old replicant group's reference count is zero (that is, there are no more members of the old replicant group—decision block 76, "yes" leg), the simulator 10 may destroy the old replicant group's data structures to reclaim the memory consumed by those data structures (block 78). Destroying the replicant group may include removing any next-state edges that point to the replicant group from other replicant groups and unallocating the memory allocated to the replicant group.

On the other hand, if the partition is a member of a replicant group (decision block 60, "yes" leg), and if the input stimuli matches a next-state edge for the replicant group (decision block 66, "yes" leg), a result of a previous simulation of a partition may be used for this partition. The simulator 10 may alias the partition to the replicant group indicated by the next-state edge that was matched (block 80). For example, the pointer to the replicant group in the partition's data structure may be updated to point to the replicant group (e.g. copied from the next-state edge). The simulator 10 may increment the reference count in the new replicant group's data structure (block 82), and decrement the reference count in the old replicant group's data structure (block 74). Additionally, the simulator 10 may check if the reference count is zero in the old replicant group's data structure and may destroy the old replicant group's data structure if so (blocks 76 and 78).

In one embodiment, creating a new replicant group for a partition may, in some cases, involve simulating the partition from the beginning of the simulation (repeating the input stimuli at each time step up to the current simulation time). For example, the partition in the new replicant group may have been deemed equivalent to the other partitions in the old replicant group, but may not be identical to the representative partition that was simulated for the replicant group. A more accurate simulation result may be obtained by repeating the simulation for the actual partition that is now in a different replicant group.

Figure 7:
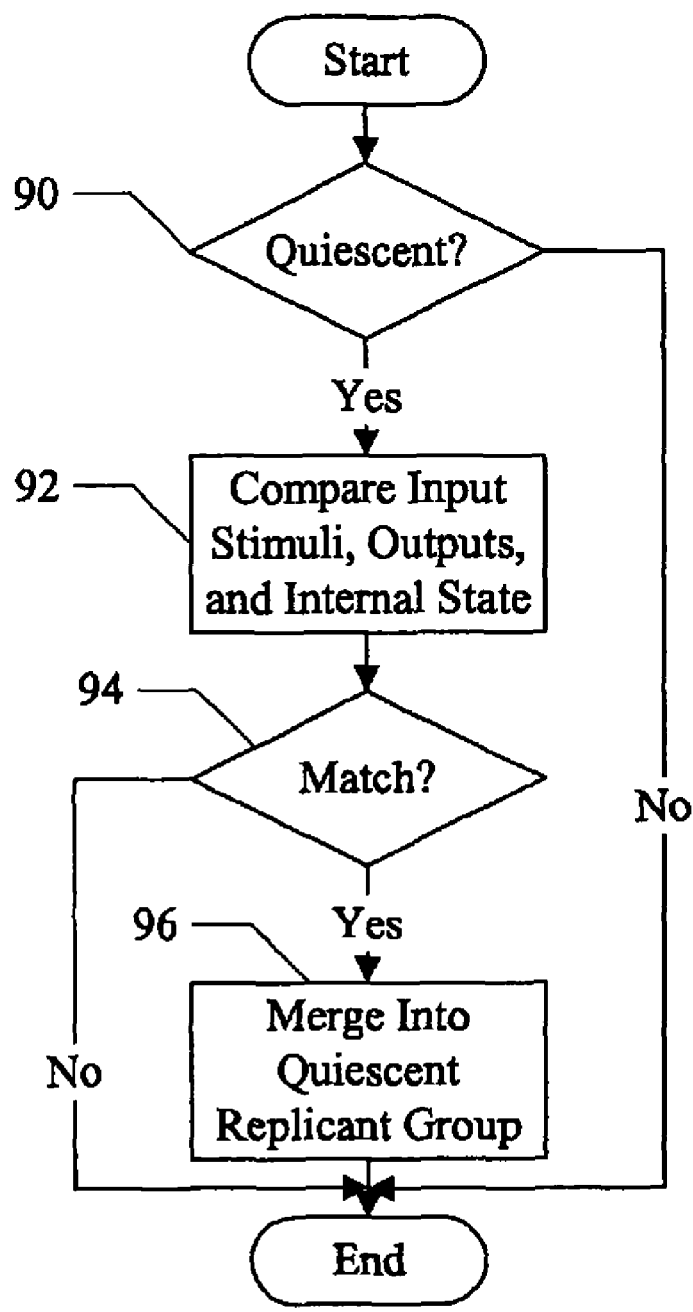
FIG. 7 is a flowchart illustrating operation of one embodiment of the simulator to merge partitions into a quiescent replicant group.

In addition to simulating partitions, the simulator 10 may also detect when partitions have reached a quiescent state (e.g. the input stimuli are constant and the internal state is constant over one or more timesteps). Such operation is illustrated in the flowchart of FIG. 7. The simulator 10 may comprise instructions which, when executed on a computer system, implement the operation illustrated in FIG. 7. While the blocks are shown in a particular order, other orders may be used.

If one or more partitions have reached a quiescent state (decision block 90, "yes" leg), the simulator 10 may compare the input stimuli of equivalent partitions and the internal state associated with the partitions (block 92). If both the input stimuli and the internal state match (within a configurable tolerance—decision block 94, "yes" leg), the simulator 10 may merge the partitions into a quiescent replicant group (block 96). The replicant group data structures may be merged, and the duplicate data structures may be destroyed to reclaim the memory consumed by those data structures. In one embodiment, replicant groups which correspond to quiescent states ("quiescent replicant groups") may be tracked by the simulator 10. If a partition reaches a quiescent state, the simulator 10 may search the quiescent states into which the partition may be merged. If no matching quiescent replicate group is found, a new quiescent replicant group is created and the partition is included in the new quiescent replicant group. Replicant groups which correspond to changing input stimuli and/or internal state are referred to as "transient replicant groups").

In one embodiment, searching for a matching quiescent group may be accomplished using a two-tiered approach. If the quiescent input and output values do not match, the internal state cannot match. Therefore, input stimuli and output values may be matched first (possibly within some tolerance). If a match is found for inputs and outputs, a full matching of internal state may be performed. If a match is still found, the partitions may be included in the same quiescent replicant group. In some cases, internal state matching may not be required (e.g. for combinatorial logic partitions).

In one embodiment, quiescence of the partitions may be the only time that equivalent partitions that have been separated into different replicant groups (because their input stimuli diverged during the simulation) are merged back into the same replicant group. Once equivalent partitions have diverged into different transient replicant groups, the likelihood that their internal state matches may be relatively low, and thus comparing the internal state may be a waste of resources. In other embodiments, merging may be attempted at other times (e.g. once simulation in a given timestep is complete).

Quiescent partitions need not be simulated as long as their input stimuli do not change. In some embodiments, non-equivalent quiescent partitions may be grouped together under a special quiescent group to avoid simulation. Such partitions may be replaced with current sources to represent any current flow between ports (including power and ground) without loss of accuracy.

Figure 8:
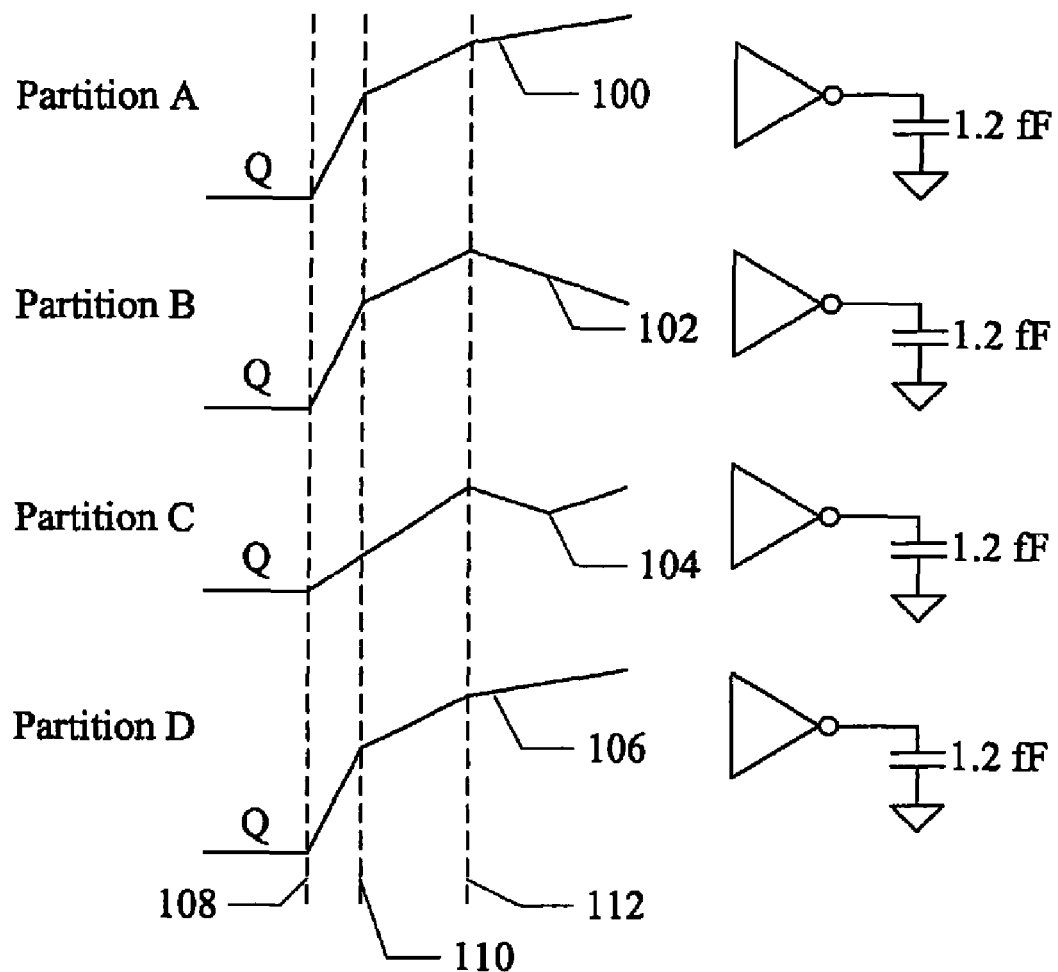
FIG. 8 is a block diagram illustrating exemplary partitions and inputs.
Figure 9:
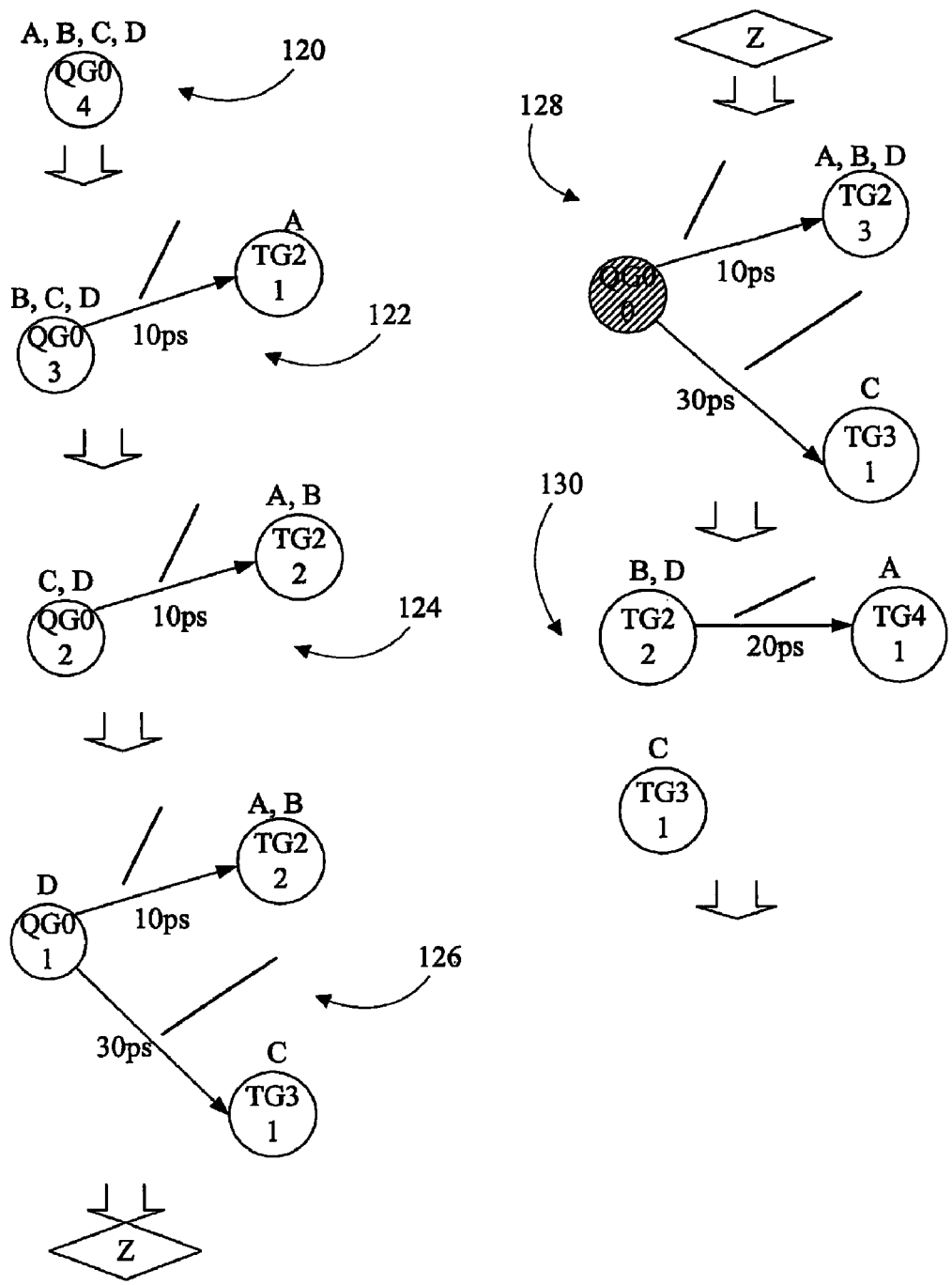
FIG. 9 is a block diagram illustrating exemplary replicant groups during a portion of a simulation of the partitions shown in FIG. 7.

Turning next to FIGS. 8 and 9, an example of equivalent partitions and a portion of a simulation for those partitions is shown. FIG. 8 illustrates the equivalent partitions A through D, which each comprise an inverter driving a 1.2 fF load in this example. The input stimulus wave forms for each partition are also shown in FIG. 8. Particularly, the input wave form 100 is in the input stimulus for partition A; the input wave form 102 is the input stimulus for partition B; the input wave form 104 is the input stimulus for partition C; and the input wave form 106 is the input stimulus for partition D. The partitions A-D each start at the same quiescent state Q, and respond to the input stimuli during the simulation. Dotted lines 108, 110, and 112 are illustrated in FIG. 8 as reference time points. The difference between dotted lines 108 and 110 is 10 picoseconds (ps), and the difference between dotted lines 110 and 112 is 20 ps in this example.

FIG. 9 illustrates various replicant groups at different points as the simulation progresses, and the large arrows between sets of states illustrate a progression to the next event in the simulation, beginning in the upper left hand corner of FIG. 9. The arrow into the diamond "z" at the bottom left hand corner of FIG. 9 and the arrow exiting the diamond "z" at the top right hand corner of FIG. 9 illustrates transition from the bottom of the left side of FIG. 9 to the top of the right side of FIG. 9. Each replicant group is shown as a circle in FIG. 9, with the name of the group and the reference count included in the circle.

At the beginning of the simulation, the four partitions A, B, C, and D are aliased to an initial quiescent replicant group QG0 (reference numeral 120). In the example, the simulator 10 simulates partition A first. Because there are no outgoing edges from QG0 leading to a potential next-state, the simulator 10 simulates partition A. In order to simulate partition A, the simulator 10 may assign a non-shared version of the internal state from group QG0 (e.g. copying the state variables from QG0), apply the input stimulus (lasting for 10 ps and having a defined slope as shown in FIG. 8) and solving partition A. The simulation of partition A uses a 10 ps timestep in this example.

The simulator 10 creates a new transient replicant group TG2 for the partition A and the internal state of partition A is the internal state of TG2. The simulator 10 adds a next-state edge between QG0 and TG2 (reference numeral 122). In the illustrated embodiment, the edge contains the time-step of simulation (10 ps), along with the slope of each input (leaving aside power and ground for the purpose of illustration, an inverter has only one input). The reference count at QG0 decreases by one (from 4 to 3) to reflect that partition A is no longer aliased to QG0. The reference count at TG2 is set to 1 since only partition A is included there at this point.

Next, the simulator schedules partition B to simulate. The simulator 10 compares the input stimulus of partition B over the outgoing next-state edges of QG0, and determines that the input stimulus of partition B matches the slope contained in the next-state edge to TG2. Accordingly, the simulator 10 avoids simulating partition B and aliases it to group TG2 (reference numeral 124). The simulator 10 reduces the reference count at QG0 from 3 to 2, and increases the count at TG2 from 1 to 2.

The simulator 10 schedules partition C to simulate. Comparing the input stimulus of partition C to the outgoing next-state edge of QG0, the simulator 10 determines that partition C has a different input stimulus. Therefore, the simulator 10 simulates partition C for 30 ps (the length of its segment of the PWL input 104) and creates a new replicant group TG3 using partition C's internal state. Additionally, the simulator 10 adds a next-state edge between QG0 and TG3 (reference numeral 126). The count at QG0 decreases from 2 to 1, and the count at TG3 is set to 1.

Moving to the top right corner of FIG. 9, the simulator 10 schedules partition D to simulate (reference numeral 128). The simulator 10 determines that the input stimulus to partition D matches that contained in the next-state edge leading to TG2. The simulator 10 aliases partition D to TG2 and avoids simulation of partition D. The count at QG0 decreases from 1 to 0, and the count at TG2 increases from 2 to 3 since partitions A, B, and D are aliased to TG2. Since the reference count of QG0 has dropped to zero, the QG0 is destroyed to reclaim memory (illustrated at reference numeral 128 with cross-hatching).

The simulator 10 schedules partition A to simulate again. Since there are no outgoing edges from TG2, the simulator 10 simulates partition A and creates a new transient group TG4 (reference numeral 130), and adds a next-state edge between TG2 and TG4. The simulator 10 decreases the reference count at TG2 from 3 to 2, and sets the count at TG4 to 1.

For brevity, the rest of the simulation of the example is not shown. Generally, the simulation continues, with simulation being avoided for a partition in a replicant group if an outgoing edge with the same input stimuli is found. When no matching transition is found, a new replicant group and edge are created so that subsequently simulated partitions may have the opportunity to avoid simulation. When the reference count of any replicant group drops to zero, the group may be erased from the replicant graph and its memory reclaimed.

In one embodiment, the simulator 10 may additionally record input stimuli for a given replicant group that caused no change to the internal state of the partition nor the outputs of the partition. Such stimuli need not be simulated, since they had no effect. The simulator 10 may detect subsequent reoccurrence of the stimuli, and may avoid simulating the partition in such cases. For example, a next-state edge may be created that points to the same replicant group for such cases.

Temporal Replicant Simulation

In one embodiment, the simulator 10 may be configured to detect temporal replicants in a simulation, and may be configured to avoid simulation of partitions if a previous simulation of the partition or an equivalent partition has been performed for the same (within a given tolerance) input stimulus. Temporal replicants are displaced in simulation time, rather than having the same input stimulus at the same simulation time, as described above. In order to implement temporal replicant simulation, the simulator 10 may be configured to retain simulation results for previously simulated partitions, and may use these results in later simulation times if an equivalent partition (or the same partition) experiences the same input stimulus.

In some cases, exploiting the temporal repetition that may be found in a simulation may result in a single simulation of a particular partition for a given input stimulus during the entire course of simulation. The equivalent partitions may then reuse this result for each occurrence of the same input stimulus, even if it occurs at different points in simulation time. As an extreme example, an inverter partition may be stimulated with a pulse train input. Because the inverter arrives back at the same state it started from, a loop is created in the replicant graph. Subsequent pulses may simply "replay" previously computed results and avoid simulation altogether.

Generally, simulation time may refer to time as measured by the simulator 10 for the circuit being simulated. The simulator 10 may advance time by timestep increments, calculating results for each time step as a function of the state from previous timesteps and the input stimulus in the current timestep. Alternatively, cycle-based simulators may advance simulation time by a clock cycle at a time (i.e. one period of the clock signal).

In one embodiment, the simulator 10 may use replicant groups and graphs (of replicant groups and next-state edges), similar to the spatial replicant simulation described above. However, when the reference count of a replicant group drops to zero, the group may not be destroyed. Thus, the simulation results recorded in the replicant group are retained, as well as next-state edges to other replicant groups. If memory usage in the computer system permits, all replicant groups may be retained. Since the replicant groups are retained, if the simulation causes a partition to return to the same replicant group at a later simulation time, the replicant group may still exist and thus simulation may still be avoided. However, in many cases, at least some replicant groups are destroyed to reclaim memory for use as other replicant groups. Many transient states occur once, and only once, in a simulation and thus need not be retained. In such embodiments, the simulator 10 may track one or more retention metrics to determine which replicant groups to retain and which to destroy.

In some embodiments, the amount of currently-unused replicant groups that are saved by the simulator 10 may be configurable. For example, the amount of memory storing currently-unused replicant groups may be configurably limited to a maximum amount.

Figure 10:
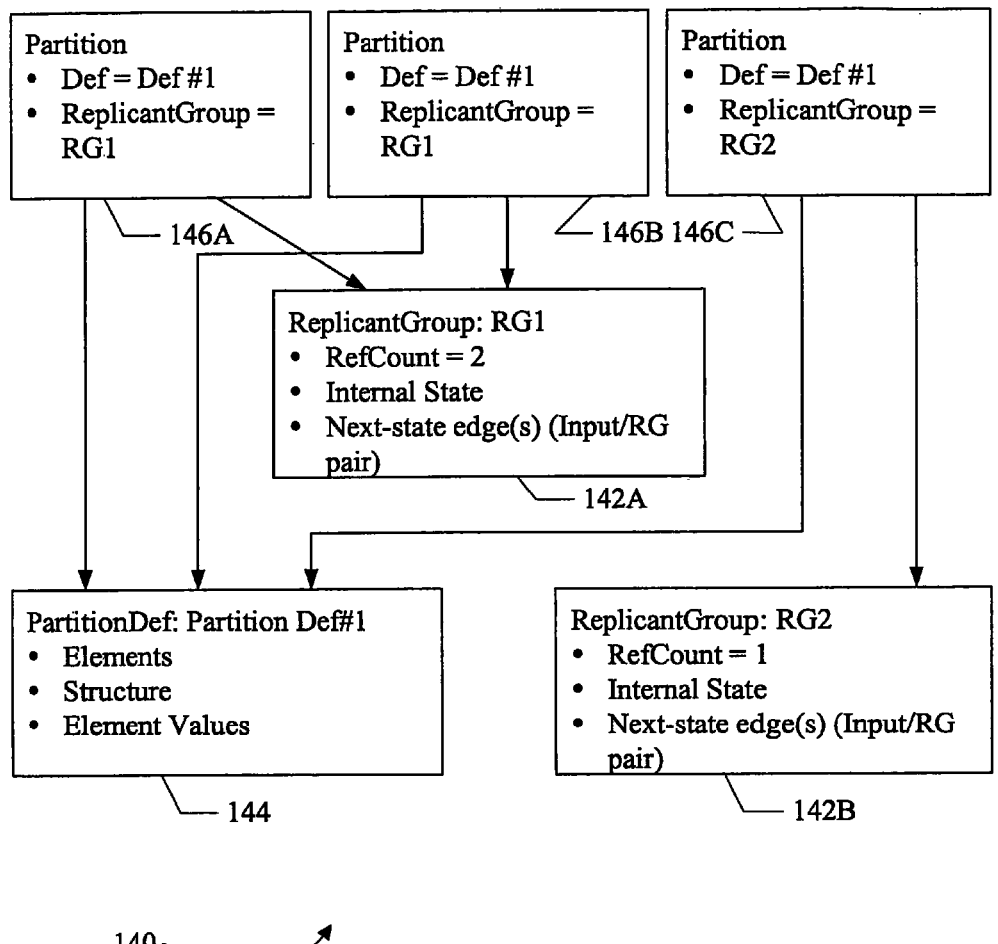
FIG. 10 is a block diagram of another embodiment of data structures that may be implemented by the simulator.

In one embodiment, the same partitioning and grouping of equivalent partitions described with respect to FIG. 2 above may be implemented by the simulator 10 for temporal replicant simulation as well. The data structures used by the simulator 10 may be similar to those described above for spatial replicant simulation as well, in one embodiment. FIG. 10 is a block diagram of one embodiment of the data structures 140 that may be used for temporal replicant simulation. The data structures include one or more replicant group data structures 142A-142B, a partition definition data structure 144, and one or more partition data structures 146A-146C. The data structures 140 may generally be similar to the data structures 50 shown in FIG. 5, in one embodiment. Specifically, the replicant group data structures 142A-142B may be similar to the replicant group data structures 52A-52B, the partition definition data structure 144 may be similar to the partition definition data structure 54, and the partition data structures 146A-146B may be similar to the partition data structures 56A-56C. Accordingly, the description with respect to FIG. 5 may generally apply to the data structures 140 also.

The replicant group data structures 142A-142B may also include one or more retention metrics, in this embodiment. The retention metrics may be used, if a replicant group is to be destroyed, to select which replicant group to destroy. Any set of one or more retention metrics may be used, in various embodiments. Some examples of retention metrics are given below, but any desired retention metrics may be used. In general, the retention metrics may measure various indications to determine, either alone or in conjunction with metrics corresponding to other replicant groups, which replicant group having a reference count of zero should be destroyed.

Exemplary retention metrics for some embodiments may comprise one or more of:

- A usage count. The usage count represents how frequently the replicant group is used. The usage count may be incremented each time a partition is aliased to the replicant group, or each time the replicant group is reused after the reference count has been reduced to zero (e.g. each time the reference count goes from zero to one). The N most frequently used replicant groups may be retained. Alternatively, a criteria may be set to save replicant groups along paths taken more than N % of the time.
- Least recently used (LRU) data. The LRU data may be maintained either among the replicant groups corresponding to a given partition definition, or among all replicant groups in the simulation. The least recently used replicant groups may be destroyed.
- Execution time to generate the result for the replicant group. Those replicant groups which required more time to generate a solution may be retained as a preference over more quickly simulated groups. The execution time may be absolute (e.g. CPU or wall clock) time, or relative execution time among the groups. The execution time for each group may also be estimated (relative to other groups) based on the composition of each group (e.g. the number of transistors in the circuitry included in the partition) and/or the number of iterations that the simulator 10 took to converge on the solution for each group.

Other methods for detecting which replicant groups to retain may also be used that do not add retention metrics to the replicant group data structures. For example, the simulator 10 may retain those replicant groups whose predecessor paths in the graph have the largest cumulative reference count. In such cases, these prior groups may eventually generate transitions to the retained groups. As another example, once the reference count drops to zero for a replicant group, that replicant group may be placed on a FIFO queue of size N. If the replicant group is reused (i.e. its reference count becomes non-zero), it is taken out of the queue. If the replicant group reaches the end of the queue without being reused, it is destroyed. In yet another example, a priority queuing scheme may be used to save N replicant groups. When a replicant group is placed on the queue, it is given a unique time-stamp. The weight used for determining priority is a product of the time since last use, and the reciprocal of the amount of execution time required to solve for that particular replicant group:

ReplicantGroup=RG

Weight(RG)=(Current time−Time-stamp(RG))*(1/ CPU Solve Time(RG))

If the queue is full and a new replicant group is to be saved, the maximum weight group is first removed and destroyed.

Figure 11:
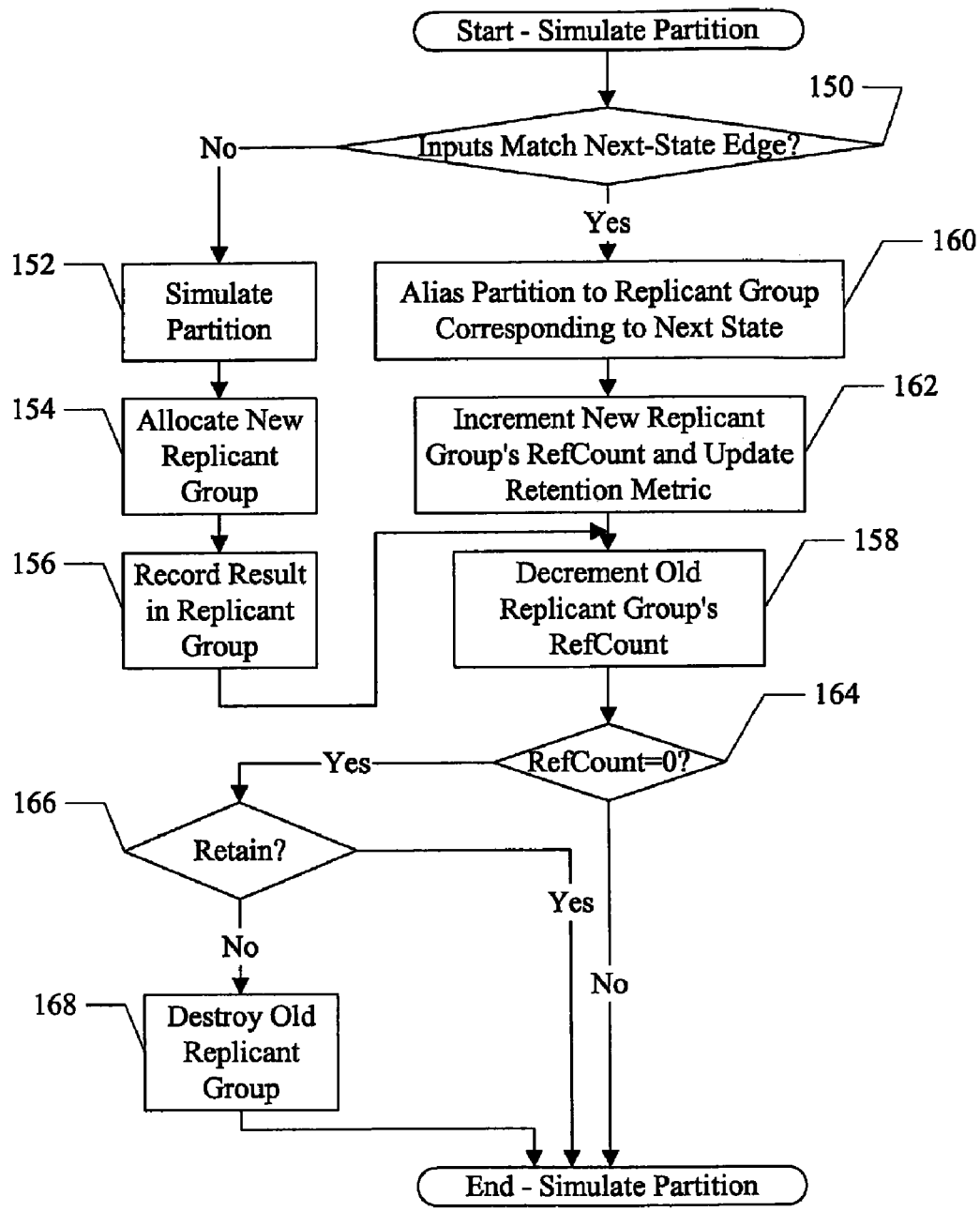
FIG. 11 is a flowchart illustrating operation of another embodiment of the simulator to simulate a partition.

Turning next to FIG. 11, a flowchart is shown illustrating operation of one embodiment of the simulator 10 to simulate a partition using temporal replicant simulation. The flowchart of FIG. 11 may be performed, for example, each time that a partition is scheduled to simulate. The simulator 10 may implement any partition scheduling algorithm. In general, any partition whose input stimuli are available and which hasn't yet been simulated may be eligible to be scheduled. The partitions may all be simulated for a given timestep before progressing to the next timestep, in some embodiments. The simulator 10 may comprise instructions which, when executed on a computer system, implement the operation illustrated in FIG. 11. While the blocks are shown in a particular order, other orders may be used.

In one embodiment, each partition may be a member of a replicant group. Even partitions which have no equivalents in a circuit description may benefit from temporal repetition of their own input stimuli. The simulator 10 may determine if the input stimulus to the partition matches any of the next-state edges in the replicant group (decision block 150). As mentioned previously, the input stimuli may be matched to within a configurable tolerance of the next-state edges. If the input stimuli does not match any of the next-state edges for the replicant group (decision block 150, "no" leg), then the input stimulus of the partition is differing from previously simulated partitions that were members of the replicant group. Accordingly, the partition will be included in a newly-created replicant group. The simulator 10 simulates the partition (block 152), and allocates a new replicant group data structure for the partition (block 154). The simulator 10 may set the reference count in the newly-created data structure to one and update the replicant group pointer in the partition data structure corresponding to the partition to point to the newly-created data structure. The simulator 10 may also update the old replicant group with a new next-state edge to point to the newly-created replicant group for the input stimuli provided to the partition. Additionally, in some embodiments, the simulator 10 may copy the internal state from the old replicant group to preserve internal state that may not be modified due to the input stimuli. In other embodiments, the simulator 10 may calculate the entire internal state when simulating the partition, and no internal state need be copied. The simulator 10 may record the result of the simulation in the internal state of the newly-created replicant group data structure (block 156) and may decrement the reference count in the old replicant group's data structure (block 158) to reflect removal of the partition from that replicant group.

On the other hand, if the input stimuli to the partition matches a next-state edge for the replicant group (decision block 150, "yes" leg), a result of a previous simulation of a partition may be used for this partition. Note that, in this case, the previous simulation may have occurred at a previous simulation time. The reference count of the replicant group indicated by the next-state edge may even be zero. The simulator 10 may alias the partition to the replicant group indicated by the next-state edge that was matched (block 160). For example, the pointer to the replicant group in the partition's data structure may be updated to point to the replicant group (e.g. copied from the next-state edge). The simulator 10 may increment the reference count in the new replicant group's data structure (block 162), and decrement the reference count in the old replicant group's data structure (block 158).

In either case, if the old replicant group's reference count is zero (that is, there are no more members of the old replicant group—decision block 164, "yes" leg), the simulator 10 may determine if the replicant group is to be retained for possible reuse in a temporal repetition of the input stimulus. Any retention mechanism, such as any of the mechanisms described above, may be used. If the old replicant group is to be retained (decision block 166, "yes" leg), the simulator 10 does not destroy the old replicant group. Otherwise (decision block 166, "no" leg), the simulator 10 may destroy the old replicant group's data structures to reclaim the memory consumed by those data structures (block 168).

Additionally, the simulator 10 may be configured to recombine replicant groups when the partitions reach quiescence, similar to FIG. 7 and the description thereof given above.

Figure 12:
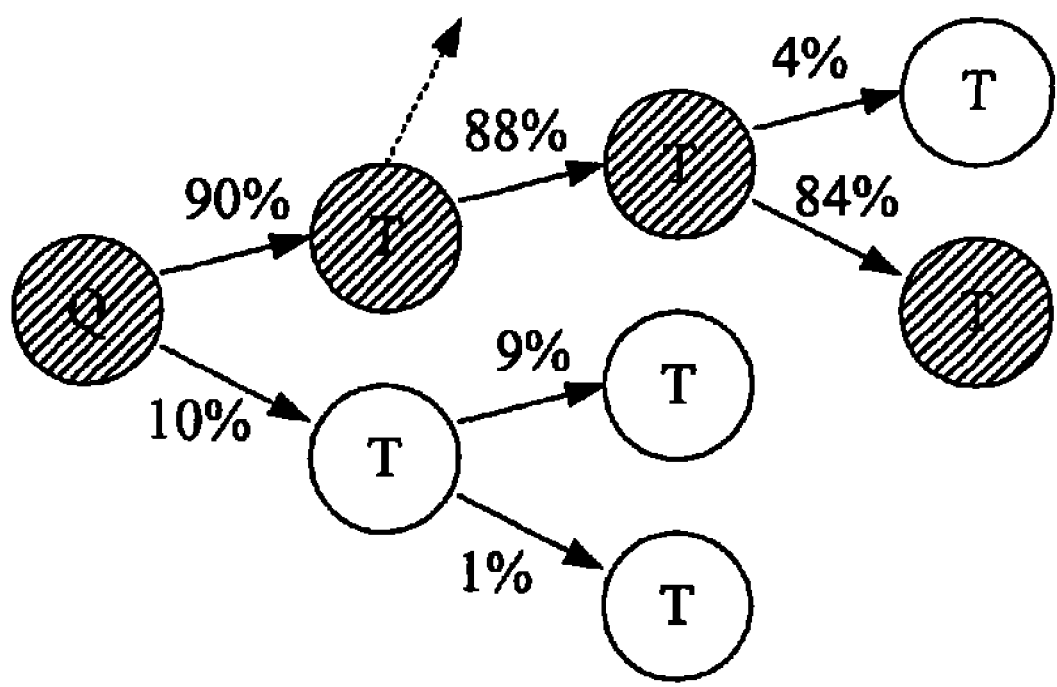
FIG. 12 is a block diagram illustrating exemplary replicant groups.

Turning now to FIG. 12, a block diagram is shown illustrating probabilities that various paths from a quiescent replicant group Q to various transient replicant groups T are taken for one example. Those replicant groups that exhibit a probability of exercise greater than a certain percent may be retained, even if their reference count temporarily drops to zero. For example, if retention is performed for those probabilities that are greater than 80%, the cross-hatched replicant groups may be retained.

In some embodiments, the probabilities may further be used to predict which path a given input stimulus will take. Subsequent simulation may be used to verify the prediction.

In some embodiments, common replicant groups may also be cached to disk, and retrieved upon subsequent analysis of the same design/partition. In this way, simulation may become faster with each analysis performed: the simulator 10 "learns" which patterns of replicant groups and transitions therebetween are intrinsic to the operation of the design under test and "replays" these previously calculated results to avoid present simulation.

In some embodiments, power consumption in the circuit being simulated may also be tracked. Current flows from the power supply and to ground (e.g. $V_{DD}$ and $V_{SS}$ in digital CMOS circuits) may be captured during the simulation to allow power consumption to be calculated.

Computer Medium and System

Figure 13:
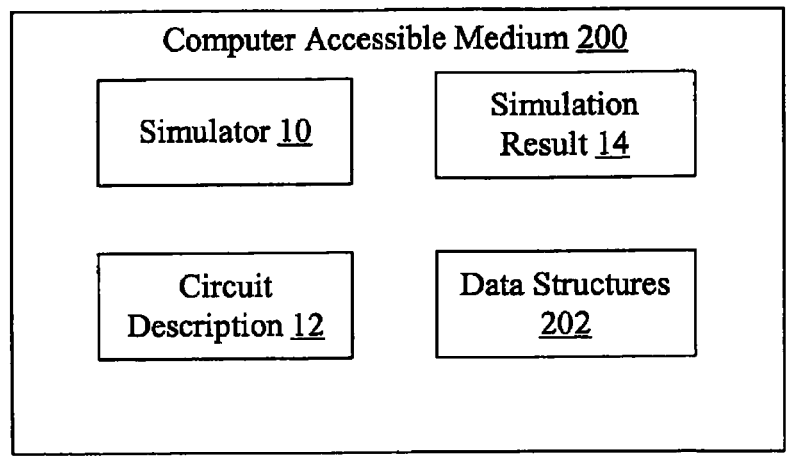
FIG. 13 is a block diagram of one embodiment of a computer accessible medium.

Turning now to FIG. 13, a block diagram of a computer accessible medium 200 is shown. Generally speaking, a computer accessible medium may include any media accessible by a computer during use to provide instructions and/or data to the computer. For example, a computer accessible medium may include storage media such as magnetic or optical media, e.g., disk (fixed or removable), tape, CD-ROM, or DVD-ROM, CD-R, CD-RW, DVD-R, DVD-RW, volatile or non-volatile memory media such as RAM (e.g. synchronous dynamic RAM (SDRAM), Rambus DRAM (RDRAM), static RAM (SRAM), etc.), ROM, Flash memory, non-volatile memory (e.g. Flash memory) accessible via a peripheral interface such as the Universal Serial Bus (USB) interface, etc., microelectromechanical systems (MEMS), etc. The media may be insertable into the computer, integrated into the computer (e.g. a fixed disk or RAM), or coupled to the computer via a communication medium such as a network and/or a wireless link.

The computer accessible medium 200 in FIG. 13 may store one or more of the simulator 10, the simulation result 14, the circuit description 12 and/or data structures 202. The data structures 202 may comprise, e.g., one or more data structures 50 such as those shown in FIG. 5 and/or one or more data structures 140 such as those shown in FIG. 10. The simulator 10 may comprise instructions which, when executed, implement the operation described herein for the simulator 10. Generally, the computer accessible medium 200 may store any set of instructions which, when executed, implement a portion or all of the flowcharts shown in one or more of FIGS. 2, 6, 7, and 11.

Figure 14:
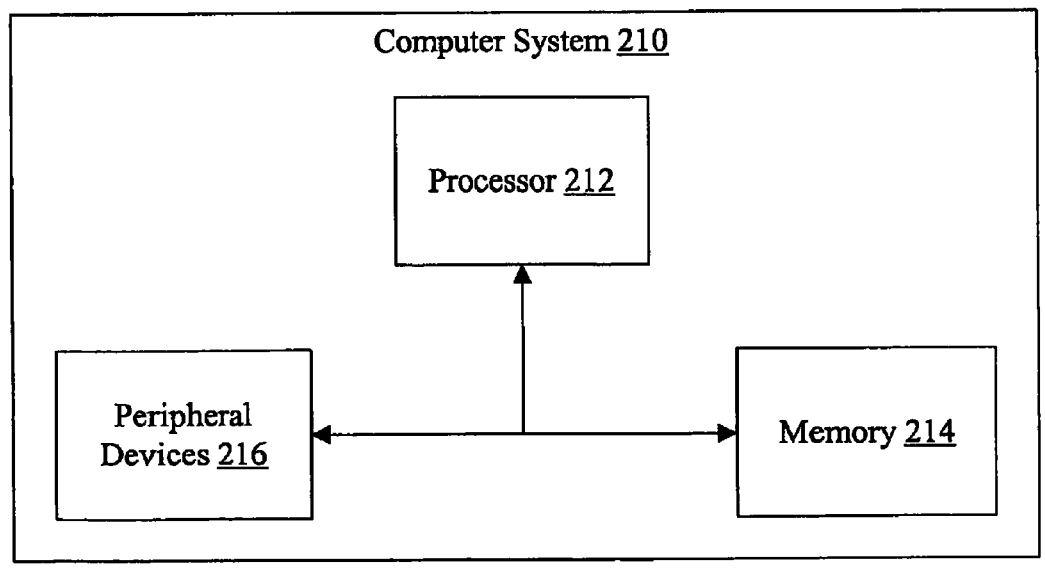
FIG. 14 is a block diagram of one embodiment of a computer system.

FIG. 14 is a block diagram of one embodiment of an exemplary computer system 210. In the embodiment of FIG. 14, the computer system 210 includes a processor 212, a memory 214, and various peripheral devices 216. The processor 212 is coupled to the memory 214 and the peripheral devices 216.

The processor 212 is configured to execute instructions, including, in one embodiment, the instructions in the software described herein. In various embodiments, the processor 212 may implement any desired instruction set (e.g. Intel Architecture-32 (IA-32, also known as x86), IA-32 with 64 bit extensions, x86-64, PowerPC, Sparc, MIPS, ARM, IA-64, etc.). In some embodiments, the computer system 210 may include more than one processor.

The processor 212 may be coupled to the memory 214 and the peripheral devices 216 in any desired fashion. For example, in some embodiments, the processor 212 may be coupled to the memory 214 and/or the peripheral devices 216 via various interconnect. Alternatively or in addition, one or more bridge chips may be used to couple the processor 212, the memory 214, and the peripheral devices 216, creating multiple connections between these components.

The memory 214 may comprise any type of memory system. For example, the memory 214 may comprise DRAM, and more particularly double data rate (DDR) SDRAM, RDRAM, etc. A memory controller may be included to interface to the memory 214, and/or the processor 212 may include a memory controller. The memory 214 may store the instructions to be executed by the processor 212 during use (including the instructions implementing the software described herein), data to be operated upon by the processor 212 during use, etc.

Peripheral devices 216 may represent any sort of hardware devices that may be included in the computer system 210 or coupled thereto (e.g. storage devices, optionally including a computer accessible medium 200, other input/output (I/O) devices such as video hardware, audio hardware, user interface devices, networking hardware, etc.).

Numerous variations and modifications will become apparent to those skilled in the art once the above disclosure is fully appreciated. It is intended that the following claims be interpreted to embrace all such variations and modifications.

What is claimed is:

1. A method comprising:
partitioning a circuit description into one or more simulateable partitions, wherein the partitioning is independent of a hierarchy specified in the circuit description;
sorting the one or more simulateable partitions into one or more groups, wherein each simulateable partition included in a given group is equivalent to each other partition in the given group with a specified tolerance;
simulating a first simulateable partition in the given group responsive to one or more input stimuli to the first simulateable partition; and
for each other simulateable partition in the given group that has approximately the same input stimuli as the first simulateable partition, using a result of simulating the first simulateable partition as a result of the other simulateable partition.

2. The method as recited in claim 1 wherein equivalence of simulateable partitions includes electrical and functional equivalence.

3. The method as recited in claim 1 further comprising:
simulating a second simulateable partition in the given group responsive to at least one input stimulus to the second simulateable partition differing from the input stimulus to the first simulateable partition; and
creating a different group for the second simulateable partition.

4. The method as recited in claim 3 further comprising:
detecting that a third simulateable partition in the given group has approximately the same input stimuli as the second simulateable partition; and
including the third simulateable partition in the different group with the second simulateable partition, wherein including the third simulateable partition in the different group comprises using a result of simulating the second simulateable partition as a result of the third simulateable partition.

5. The method as recited in claim 3 further comprising:
reaching a same quiescent state, within a specified tolerance, in the first simulateable partition and the second simulateable partition; and
merging the first simulateable partition and the second simulateable partition into a quiescent group corresponding to the quiescent state.

6. The method as recited in claim 1 wherein each group comprises an internal state corresponding to the simulateable partitions in the group, and wherein the simulateable partitions share the internal state.

7. The method as recited in claim 6 wherein simulating the first simulateable partition comprises:
creating a new group for the first simulateable partition;
copying the internal state from the given group to the new group;
updating the internal state of the new group based on the result of simulating the first simulateable partition;
including the first simulateable partition in the new group; and
removing the first simulateable partition from the given group.

8. The method as recited in claim 7 wherein using the result of simulating the first simulateable partition comprises including the other simulateable partition in the new group and removing the other simulateable partition from the given group.

9. The method as recited in claim 8 further comprising, if there are no more simulateable partitions included in the given group, destroying the given group.

10. The method as recited in claim 1 wherein the sorting comprises grouping equivalent simulateable partitions from different levels in the hierarchy into the same group.

11. The method as recited in claim 1 wherein the groups comprise one or more quiescent groups and one or more transient groups, and the method further comprising, for at least the transient groups:
tracking at least one retention metric; and
retaining one or more transient groups that include no simulateable partitions responsive to the retention metric.

12. The method as recited in claim 1 further comprising grouping quiescent partitions with constant input stimuli into a group even if the partitions are not equivalent.

13. A computer accessible medium storing a plurality of instructions which, when executed, implement a method comprising:
partitioning a circuit description into one or more simulateable partitions, wherein the partitioning is independent of a hierarchy specified in the circuit description;
sorting the one or more simulateable partitions into one or more groups, wherein each simulateable partition included in a given group is equivalent to each other partition in the given group within a specified tolerance;
simulating the a first simulateable partition in the given group responsive to one or more input stimuli to the first simulateable partition; and
for each other simulateable partition in the given group that has approximately the same input stimuli as the first simulateable partition, using a result of simulating the first simulateable partition as a result of the other simulateable partition.

14. The computer accessible medium as recited in claim 13 wherein the method further comprises:
simulating a second simulateable partition in the given group responsive to at least one input stimulus to the second simulateable partition differing from the input stimulus to the first simulateable partition; and
creating a different group for the second simulateable partition.

15. The computer accessible medium as recited in claim 14 wherein the method further comprises:
detecting that a third simulateable partition in the given group has approximately the same input stimuli as the second simulateable partition; and
including the third simulateable partition in the different group with the second simulateable partition, wherein including the third simulateable partition in the different group comprises using a result of simulating the second simulateable partition as a result of the third simulateable partition.

16. The computer accessible medium as recited in claim 15 wherein the method further comprises:
reaching a same quiescent state, within a specified tolerance, in the first simulateable partition and the second simulateable partition; and
merging the first simulateable partition and the second simulateable partition into a quiescent group corresponding to the quiescent state.

17. The computer accessible medium as recited in claim 16 wherein each group comprises an internal state corresponding to the simulateable partitions in the group, and wherein the simulateable partitions share the internal state, and simulating the first simulateable partition comprises:
creating a new group for the first simulateable partition;
copying the internal state from the given group to the new group;
updating the internal state of the new group based on the result of simulating the first simulateable partition;
including the first simulateable partition in the new group; and
removing the first simulateable partition from the given group.

18. The computer accessible medium as recited in claim 17 wherein using the result of simulating the first simulateable partition comprises including the other simulateable partition in the new group and removing the other simulateable partition from the given group.

19. The computer accessible medium as recited in claim 13 wherein the sorting comprises grouping equivalent simulateable partitions from different levels in the hierarchy into the same group.

20. The computer accessible medium as recited in claim 13 wherein the groups comprise one or more quiescent groups and one or more transient groups, and the method further comprises, for at least the transient groups:
tracking at least one retention metric; and
retaining one or more transient groups that include no simulateable partitions responsive to the retention metric.

21. A method comprising:
partitioning a circuit description into one or more simulateable partitions, wherein the partitioning is independent of a hierarchy specified in the circuit description;

simulating the one or more simulateable partitions, wherein the simulating comprises:
sorting the one or more simulateable partitions into one or more groups, wherein each simulateable partition included in a given group is equivalent within a specified tolerance, and wherein each group comprises an internal state that is reached at a point during the simulation for at least one simulateable partition; and
moving a first simulateable partition from a first group to a second group responsive to the input stimuli to the first simulateable partition being approximately the same as the input stimuli to a previously simulated simulateable partition that was included in the first group and the second group was created in response to simulating the previously simulated simulateable partition.

22. The method as recited in claim 1 wherein a second simulateable partition in the given group has a second output load that differs from a first output load of the first simulateable partition, the method further comprising scaling the result of simulating the first simulateable partition to obtain a result of the second simulateable partition.

23. The method as recited in claim 22 wherein the given group is hierarchical, and wherein a first level of the hierarchy comprises structural/functional equivalence of the partitions in the group, and wherein a second level of the hierarchy comprises output loads of the partitions in the given group.

24. The computer accessible medium as recited in claim 13 wherein a second simulateable partition in the given group has a second output load that differs from a first output load of the first simulateable partition, the method implemented by executing the instructions further comprises scaling the result of simulating the first simulateable partition to obtain a result of the second simulateable partition.

25. The computer accessible medium as recited in claim 24 wherein the given group is hierarchical, and wherein a first level of the hierarchy comprises structural/functional equivalence of the partitions in the group, and wherein a second level of the hierarchy comprises output loads of the partitions in the given group.

26. The method as recited in claim 7 further comprising:
creating a link from the given group to the new group; and
associating the input stimuli to the first simulateable partition with the link;
wherein using the result of simulating the first simulateable partition comprises:
detecting that the input stimuli to the other simulateable partition is approximately the same as the input stimuli associated with the link; and
following the link to the new group.

27. The computer accessible storage medium as recited in claim 17 wherein the method further comprises:
creating a link from the given group to the new group; and
associating the input stimuli to the first simulateable partition with the link;
wherein using the result of simulating the first simulateable partition comprises:
detecting that the input stimuli to the other simulateable partition is approximately the same as the input stimuli associated with the link; and
following the link to the new group.

28. The method as recited in claim 21 wherein moving the first simulateable partition comprises matching the input stimuli to the input stimuli associated with a link from the first group to the second group and following the link to the second group.

* * * * *